(12) United States Patent
Huang

(10) Patent No.: US 7,501,856 B2
(45) Date of Patent: Mar. 10, 2009

(54) VOLTAGE LEVEL SHIFTER

(75) Inventor: Chao-Sheng Huang, Taipei (TW)

(73) Assignee: Via Technologies, Inc., Hsin Tien, Taipei Hsien (TW)

( * ) Notice: Subject to any disclaimer, the term of this patent is extended or adjusted under 35 U.S.C. 154(b) by 31 days.

(21) Appl. No.: 11/522,988

(22) Filed: Sep. 19, 2006

(65) Prior Publication Data

US 2007/0063734 A1    Mar. 22, 2007

(30) Foreign Application Priority Data

Sep. 20, 2005    (TW) .............................. 94132521 A

(51) Int. Cl.
*H03K 19/0175* (2006.01)
(52) U.S. Cl. .......................... 326/81; 326/68; 327/333
(58) Field of Classification Search .................. 326/68, 326/83, 62, 63, 80–82, 86, 87; 327/333
See application file for complete search history.

(56) References Cited

U.S. PATENT DOCUMENTS

| 6,642,769 B1* | 11/2003 | Chang et al. ................. 327/333 |
| 6,734,704 B1* | 5/2004 | Burkland ....................... 326/63 |
| 2004/0169542 A1* | 9/2004 | Kouzuma .................... 327/333 |
| 2005/0156631 A1* | 7/2005 | Huang ........................... 326/81 |

* cited by examiner

*Primary Examiner*—Rexford Barnie
*Assistant Examiner*—Jany Tran
(74) *Attorney, Agent, or Firm*—Birch, Stewart, Kolasch & Birch, LLP

(57) ABSTRACT

Disclosed is a voltage level shifter, including a pull-up circuit, a voltage drop circuit and a pull-down circuit. Through the voltage level shifter, an input voltage is transformed into an output voltage having a different level as compared to that of the input voltage. With the voltage drop circuit, voltages received by the pull-down circuit are reduced and thus transistors of thinner gates may be used, effectively improving switching speed of transistors in the pull-down circuit. As such, noise and jiggle of the output voltage are reduced.

8 Claims, 4 Drawing Sheets

VOLTAGE LEVEL SHIFTER

BACKGROUND OF THE INVENTION

1. Field of the Invention

The present invention pertains to a circuit. More particularly, the present invention pertains to a voltage level shifter.

2. The Prior Arts

For a currently used integrated circuit (IC) system, a core logic unit and an input/output unit therein are generally supplied with different voltages. For example, the core logic unit is typically supplied with a voltage of 1.2 volts while the input/output devices with a voltage of 3.3 volts in a device fabricated by 0.13 μm manufacturing process. Since the voltages supplied to the core logic unit and input/output unit are not identical to each other, a conversion circuit is required to be provided between the two units. Such conversion circuit is generally termed as "voltage level shifter".

FIG. 1 shows a conventional voltage level shifter. The voltage level shifter 10 includes PMOS transistors PG1 and PG2, NMOS transistors NG1 and NG2 and an inverter INV. Herein, the PMOS transistors PG1 and PG2 are regarded as pull-up transistors while the NMOS transistors NG1 and NG2 are regarded as pull-down transistors. Now, assuming a supply voltage VccH is 3.3 volts and an input voltage Vin at an input I is between 0 and 1.2 volts of rectangular wave. When the input voltage Vin transits from a low level (ex. 0 volt) to a high level (ex. 1.2 volts), the NMOS transistor NG1 is turned on and the PMOS transistor PG2 is also turned on since a gate of the PMOS transistor PG2 is driven to low level. Hence, a high level voltage (i0e. 3.3 volt) is presented at an output node O of the voltage level shifter 10. Therefore, the voltage level shifter 10 is capable of shifting the input voltage Vin (i.e. 1.2 volts) into the output voltage Vout (i.e. 3.3 volts). However, since a specific period is required for a voltage of 0 volt being shifted into 1.2 volts, the PMOS and NMOS transistors PG1, PG2,NG1 and NG2 may not function as desired in the voltage level shifter 10 when their gate voltages are too low (lower than a threshold voltage, about 0.8 volts). In addition, during the time when the PMOS transistor PG2 and NMOS transistor NG2 are approaching to on (or off) and off (or on), contribution of the transistors PG2, NG2 on the output voltage Vout compete. As such, the output voltage Vout is later in speed in reaching the low level, compared with only either of the PMOS transistor PG2 and NMOS transistor NG2 is present, causing distortion of the output wave.

FIG. 2 is provided to explain such case. When the input voltage Vin transits from the low level to the high level, the output voltage Vout is pulled to the high level after a delay time Tr. Also, when the input voltage Vin transits from the high level to the low level, the output voltage Vout decreases to the low level after a delay time Tf.

When noises of different levels are present on the input voltage Vin and thus the real input voltage Vin may not be maintained constant, distortion amount caused from the competition varies, leading to a shift on the transition time of the output voltage Vout, which is called "jiggle". It is generally desirable to reduce such jiggle so as to have a better fidelity of the output wave with respect to the input wave. In addition, the output wave may vary as the noise amount on the input wave varies since the transistors in the voltage level shifter may function differently at this time as compared to that when no noise is present. It is desired to reduce such output wave deviation.

In addition, since the NMOS transistors NG1, NG2 have a high voltage to endure, which is about 2.5 volts at its maximum, the gates thereof have to be thicker, thus leading to a higher threshold voltage. In this case, the NMOS transistors NG1, NG2 have to have more time to switch from low to high. Therefore, it is desired to have a thinner gate for the pull-down transistors NG1, NG2 so that they may have a faster switching speed.

SUMMARY OF THE INVENTION

A voltage level shifter having reduced noises and jiggle at an output thereof is provided.

The voltage level shifter includes a pull-up circuit, a voltage drop circuit and a pull-down circuit. The voltage drop circuit is used to reduce voltages which the pull-down circuit endures, making gate thickness of the pull-down transistors of the pull-down circuit allowed to be reduced.

The voltage level shifter includes a pull-up circuit, a voltage drop circuit, a path division circuit and a pull-down circuit. The path division circuit isolates a current between the pull-up and pull-down circuits at a time when an input voltage of the voltage level shifter transits from one level to the other level. Therefore, competence between the pull-up and pull-down circuits does not appear and thus noise amount and jiggle on an output voltage of the voltage level shifter are reduced.

The above and other objects, advantages and principle will be further explained below taken from the preferred embodiments with reference to the accompanying drawings.

BRIEF DESCRIPTION OF THE DRAWINGS

The drawings disclose an illustrative embodiment of the present invention which serves to exemplify the various advantages and objects hereof, and are as follows.

DETAILED DESCRIPTION OF THE PREFERRED EMBODIMENT

A voltage level shifter having reduced noises and jiggle at an output thereof is provided in the invention.

Figure 1:
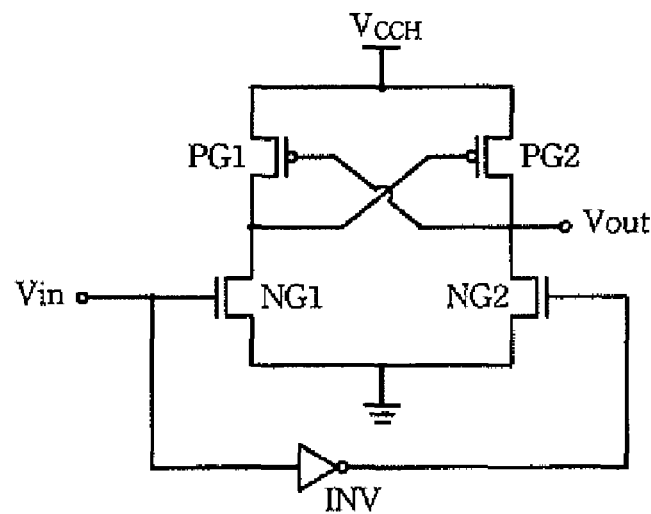
FIG. 1 is a schematic diagram of a conventional voltage level shifter.
Figure 2:
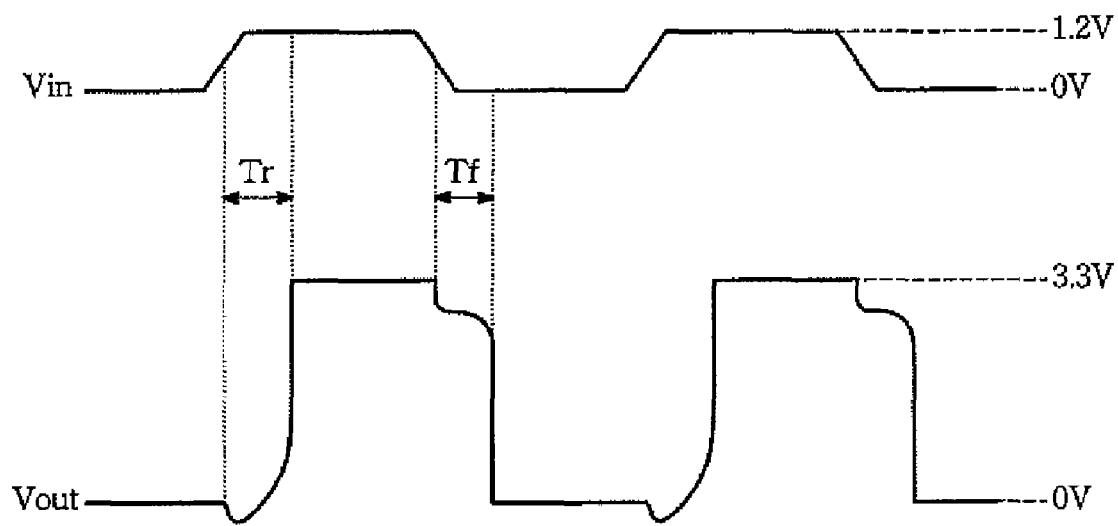
FIG. 2 is a schematic diagram of a waveform of the voltage level shifter shown in FIG. 1.
Figure 3:
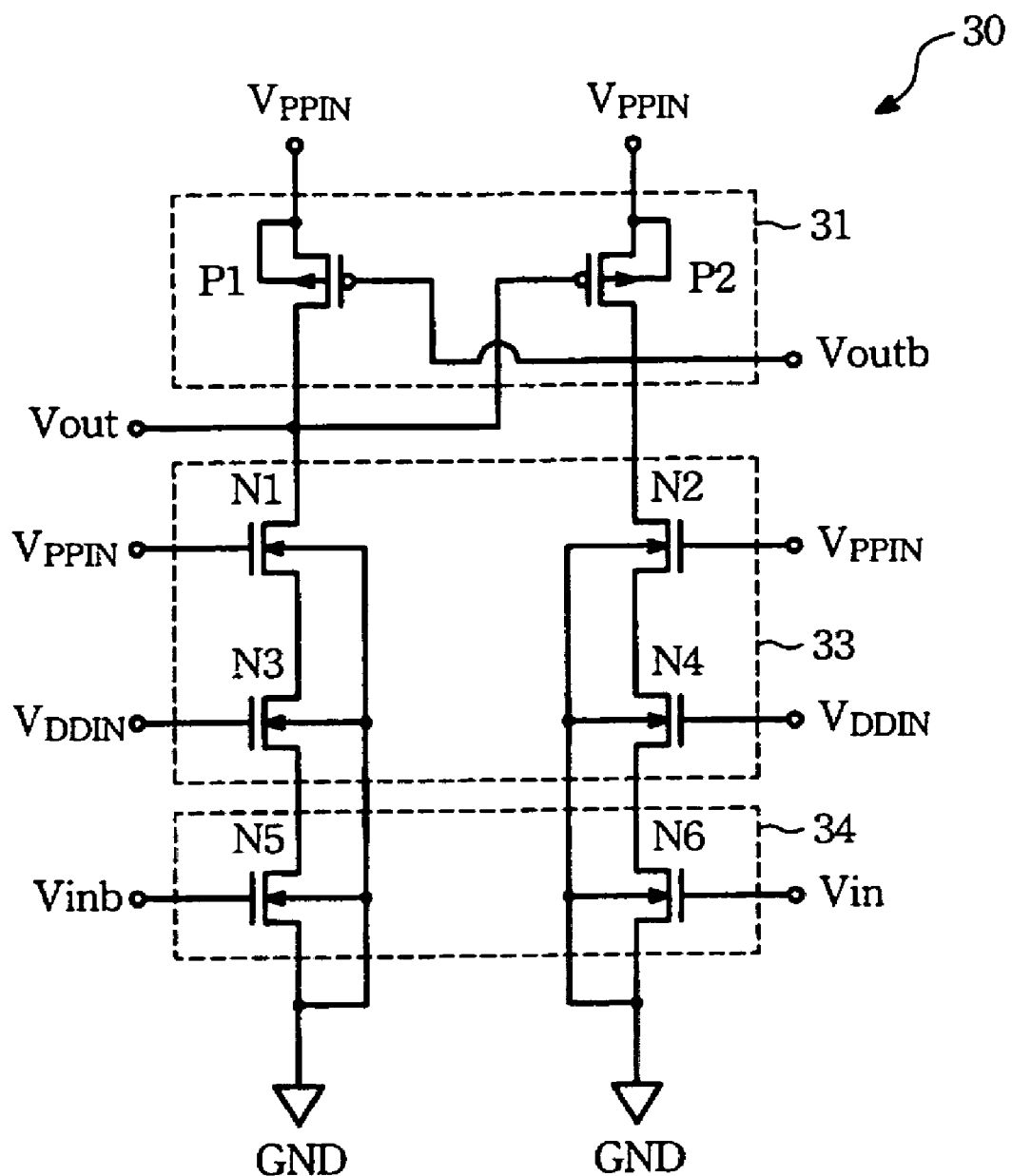
FIG. 3 is a schematic diagram of a voltage level shifter according to an embodiment of the present invention.

Referring to FIG. 3, a voltage level shifter according to an embodiment of the present invention is shown therein. As shown, the voltage level shifter 30 includes a pull-up circuit 31, a voltage drop circuit 33 and a pull-down circuit 34. The pull-up circuit 31 has two PMOS transistors P1 and P2. The voltage drop circuit 33 has four NMOS transistors N1, N2, N3, and N4. The pull-down circuit 34 has two NMOS transistors N5 and N6. In this embodiment, a direct current (DC) voltage $V_{PPIN}$ and a DC voltage source VDDIN are provided for the voltage level shifter 30. The NMOS transistors N5 and N6 are connected to ground GND. In this configuration, an input voltage Vin is shifted into an output voltage Vout at node NT1. The DC voltage $V_{PPIN}$ is 3.3 volts, the DC voltage $V_{DDIN}$ is 1.2 volts, the input voltage Vin has a rectangular wave between 0 and 1.2 volts, and the output voltage Vout is a corresponding wave between 0 and 3.3 volts. In addition, the voltage level shifter 30 further includes an inverter INV (not shown) for providing a inversed input voltage Vinb, the inverse voltage of the input voltage Vin, and outputting a inversed output voltage Voutb at NT2.

When the input voltage Vin is transiting from high level to low level and the inversed input Vinb is transiting from low level to high level. At this time, the NMOS transistor NMOS is turned on while the NMOS transistor N6 is turned off. However, such switch is not immediately finished. When a gate voltage of the NMOS transistors N5, N6 do not exceed a threshold voltage (about 0.7 volts), the NMOS transistors N5, N6 can not be turned on or off. At this time, the output voltage Vout is transiting from high level to low level and the PMOS transistor P2 is turned on. On the other hand, the inversed output Voutb is transiting from low level to high level and the PMOS transistor P1 is turned off. When the NMOS transistor N5 becomes really turned on, the output Vout is reduced to low, enabling the PMOS transistor P2 to be turned on. On the other hand, when the NMOS transistor N6 is really turned off, the inversed output Voutb is pulled high, enabling the PMOS transistor P1 to be turned off. Therefore, when the input voltage Vin is at the low level (ex. 0 volt), the output voltage Vout is also at the low level (i.e. 0 volt). When the inversed input voltage Vinb is at the high level (ex. 1.2 volts), the inverse output voltage Voutb is also at the high level (i.e. 3.3 volts). As such, the purpose of voltage shifting is achieved.

In addition, in the voltage drop circuit 33, the NMOS transistors N1, N2 has a thicker gate (corresponding to a threshold voltage about 0.8 volts), while the NMOS transistors N3, N4 has a thinner gate (corresponding to a threshold voltage about 0.7 volts). Hence, the voltage provided by the pull-up circuit 31 is reduced by about 1.5 volts by the voltage drop circuit 33 when the NMOS transistors N5, N6 are turned off; otherwise, there is no voltage drop when the NMOS transistors N5, N6 are turned on. Consequently, the gate of the NMOS transistors N5, N6 may be thinner and may be turned on by the input voltage Vin at an initial stage (when the input voltage Vin is still lower) when the input voltage Vin transits from low level to high level. Hence, the NMOS transistors N5, N6 may be turned on in a relatively short time. Alternatively, the NMOS transistors N1, N2, N3, and N4 may each be replaced with a diode (not illustrated) since the diode may also provide a voltage drop, which makes no difference with the NMOS transistors N1, N2, N3, and N4.

Figure 4:
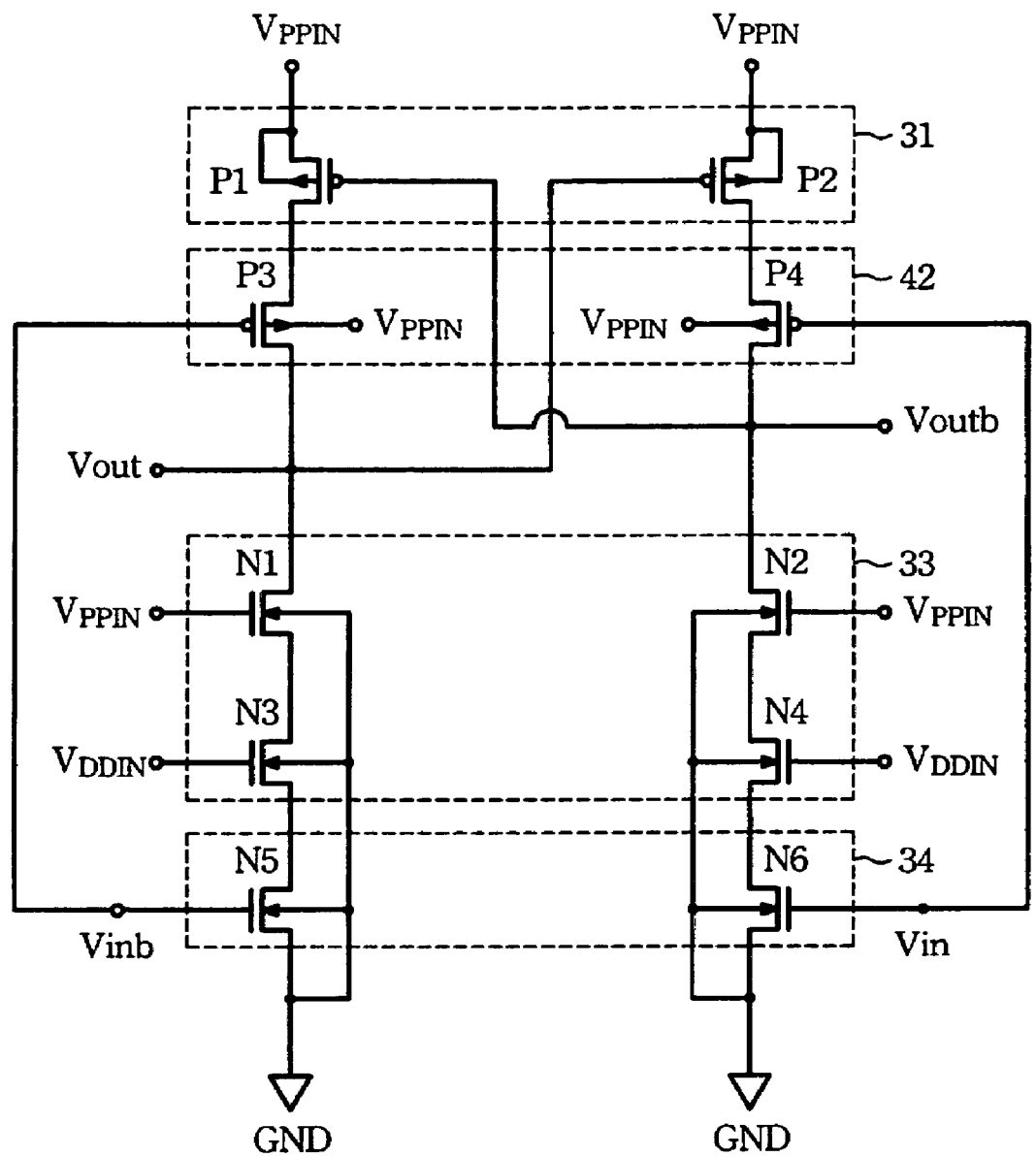
FIG. 4 is a schematic diagram of the voltage level shifter according to another embodiment of the present invention.

Referring to FIG. 4, the voltage level shifter according to another embodiment of the present invention is shown therein. In this embodiment, all elements of and DC voltages supplied for the voltage level shifter are the same with those for the embodiment shown in FIG. 3 except that a path division circuit 42 is additionally provided. The path division circuit 42 is connected between the pull-up circuit 31 and the voltage drop circuit 33 and for isolating a current path between the pull-up circuit 31 and the pull-down circuit 34. The path division circuit 42 includes PMOS transistors P3 and P4. When the input voltage Vin transits from low level to high level, the NMOS transistor N6 is turned on, the PMOS transistor P1 is also turned on and the PMOS transistor P3 is turned off. When the input voltage Vin rises sufficiently to turn off the PMOS transistor P3, a current path between the PMOS transistor P1 and the NMOS transistor N5 is isolated. Thus, the PMOS transistor P1 cannot pull up the output voltage Vout any more but the NMOS transistor N5 keeps pulling down the output voltage Vout. That is, the PMOS P1 transistor does not compete with the NMOS transistor N5 again when the current path is isolated. At this time, the output voltage Vout may be rapidly decreased to low level when the PMOS transistor P3 is turned off. As such, the voltage level shifter may have reduced jiggle of transition time at the output end owing to an unstable input voltage Vin.

Figure 5A:
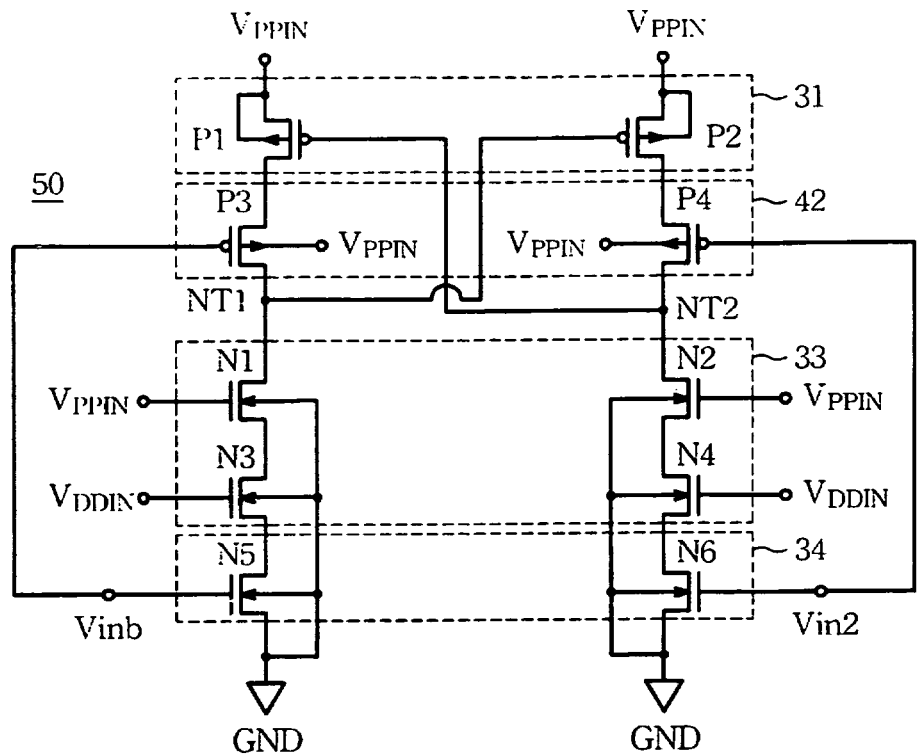
FIG. 5a is a schematic diagram of a main conversion stage of the voltage level shifter according to still another embodiment of the present invention.
Figure 5B:
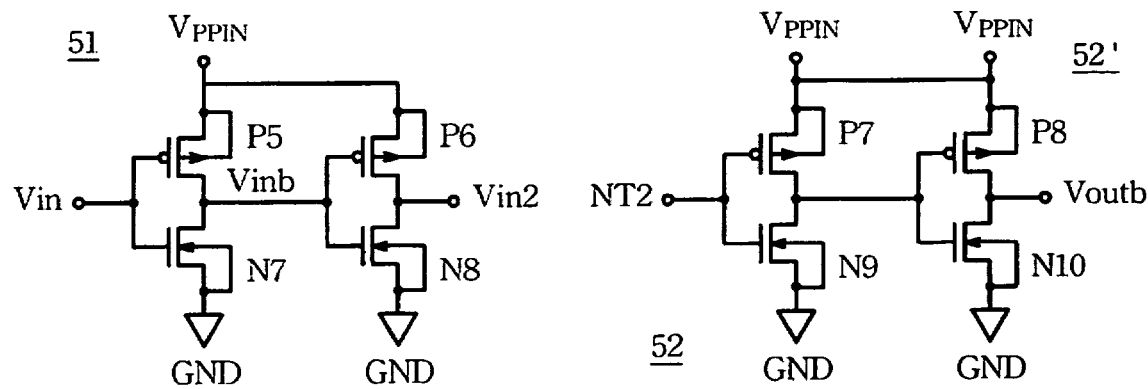
FIG. 5b is a schematic diagram of an input buffer stage of the voltage level shifter according to the embodiment, shown in FIG. 5a of the present invention.
Figure 5C:
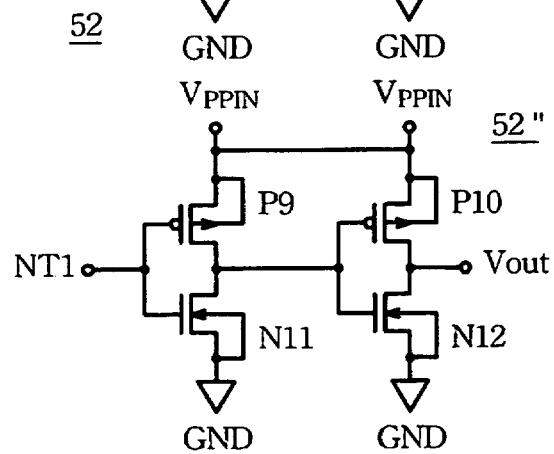
FIG. 5c is a schematic diagram of an output buffer stage of the voltage level shifter according to the embodiment, shown in FIG. 5a of the present invention.

Referring to FIG. 5a, FIG. 5b and FIG. 5c, the voltage level shifter according to another embodiment of the present invention is shown therein. In this embodiment, the voltage level shifter 50 is composed of the voltage level shifter shown in FIG. 3 and FIG. 4 (FIG. 5a) and an input stage buffer circuit 51 (FIG. 5b) and an output stage buffer circuit 52 (FIG. 5c). As shown, the input stage buffer circuit 51 includes PMOS transistors P5 and P6 and NMOS transistors N7 and N8, wherein the PMOS transistor P5 and the NMOS transistor N7 constitute a first CMOS transistor, and the PMOS transistor P6 and the NMOS transistor N8 constitute a second CMOS transistor The output stage buffer circuit 52 includes a first output buffer circuit 52' and a second output buffer circuit 52''. The first output buffer circuit 52' includes PMOS transistors P7, P8 and NMOS transistors N9, N10, wherein the PMOS transistor P7 and the NMOS transistor N9 constitute a third CMOS transistor, and the PMOS transistor P8 and the NMOS transistor N10 constitute a fourth CMOS transistor. The second output buffer circuit 52'' includes PMOS transistors P9, P10 and NMOS transistors N11, N12, wherein the PMOS transistor P9 and the NMOS transistor N11 constitute a fifth CMOS transistor, and the PMOS transistor P10 and the NMOS transistor N12 constitute a sixth CMOS transistor. In the voltage level shifter 50, the input stage buffer circuit 51 and output stage buffer circuit 52 is provided to facilitate measurement of the output voltage Vout and inverse output voltage Voutb shown in FIG. 3 and FIG. 4. In the voltage level shifter 50, the first input buffer circuit 52' and second output buffer circuit 52'' may be replaced with two inverters connected in series. As such, a buffered input voltage Vin2 and buffered output voltages Voutb and Vout may also be obtained. In addition, the output voltage Voutb is obtained from a voltage presented at a node NT2, which is buffered at the first output buffer circuit 52'. Similarly, the output voltage Vout is obtained from a voltage presented at a node NT1, which is buffered at the second output buffer circuit 52''.

Many changes and modifications in the above described embodiment of the invention can, of course, be carried out without departing from the scope thereof. Accordingly, to promote the progress in science and the useful arts, the invention is disclosed and is intended to be limited only by the scope of the appended claims. For example, the transistors mentioned above may be replaced with tri-terminal switches. The essential principle of the invention may also be applied onto a voltage level shifter which has a lower output as compare to its input. In this case, the voltage drop transistors are not required and the applied DC voltages should be adjusted in such a manner that the voltage level shifter may operate properly. In this regard, the scope of the invention should be otherwise defined by the claims provided below.

What is claimed is:

1. A voltage level shifter, comprising:
 a pull-up circuit having a first PMOS transistor and a second PMOS transistor with source terminals thereof connected to a first voltage source;
 a path division circuit having a third PMOS transistor and fourth PMOS transistor with gates thereof connected to a second input voltage and a first input voltage, respectively, and with source terminals connected to drain terminals of the first PMOS transistor and second PMOS transistor, and with a drain terminal of the third PMOS transistor as a first output terminal and connected to a gate terminal of the second PMOS transistor and still a drain terminal of the fourth PMOS transistor as a second output terminal and connected to a gate terminal of the first PMOS transistor, and the second input voltage being an inverse signal of the first input voltage;

a voltage drop circuit having a first NMOS transistor and a second NMOS transistor over a third NMOS transistor, and a fourth NMOS transistor, respectively, and the first NMOS transistor and the second NMOS transistor having source terminals connected to drain terminals of the third PMOS transistor and fourth PMOS transistor, respectively, the first second, third and fourth NMOS transistors being turned on; and a pull-down circuit having a fifth NMOS transistor and a sixth NMOS transistor with source terminals thereof grounded, the fifth NMOS transistor and sixth NMOS transistor having drain terminals connected to source terminals of the third NMOS transistor and fourth NMOS transistor, respectively, and having gates connected to the second input signal and first input signal, respectively.

2. The voltage level shifter according to claim 1, wherein the first NMOS transistor and the second NMOS transistor having gates connected to the first voltage source.

3. The voltage level shifter according to claim 1, wherein the third NMOS transistor and the fourth NMOS transistor have gates connected to a second voltage source.

4. The voltage level shifter according to claim 1, wherein the third NMOS transistor and the fourth NMOS transistor have thinner gates than those of the gates of the first NMOS transistor and the second NMOS transistor.

5. The voltage level shifter according to claim 4, wherein the second voltage source is lower than the first voltage source.

6. The voltage level shifter according to claim 1, further comprising a first CMOS transistor cascade connected with a second CMOS transistor and using the first voltage source as a power so as to generate the second input voltage from an output terminal of the first CMOS transistor and the first input voltage from the an output terminal of the second CMOS transistor while receiving an input signal.

7. The voltage level shifter according to claim 1, further comprising a third CMOS transistor cascade connected with a fourth CMOS transistor and using the first voltage source as a power so as to receive a second output voltage outputted from the second output terminal and feed into an input terminal of the third CMOS transistor, and then output an second output voltage from an output terminal of the fourth CMOS transistor.

8. The voltage level shifter according to claim 1, further comprising a fifth CMOS transistor cascade connected with a sixth CMOS transistor and using the first voltage source as a power so as to receive a first output voltage outputted from the first output terminal and feed into an input terminal of the fifth CMOS transistor, and then output an first output signal from an output terminal of the sixth CMOS transistor.

* * * * *